United States Patent
Zaitsu et al.

(10) Patent No.: US 8,884,648 B2
(45) Date of Patent: *Nov. 11, 2014

(54) PROGRAMMABLE LOGIC SWITCH

(71) Applicant: Kabushiki Kaisha Toshiba, Tokyo (JP)

(72) Inventors: Koichiro Zaitsu, Kawasaki (JP);
Kosuke Tatsumura, Kawasaki (JP);
Mari Matsumoto, Yokohama (JP);
Shinichi Yasuda, Tokyo (JP); Masato Oda, Yokahama (JP); Haruka Kusai, Yokohama (JP); Kiwamu Sakuma, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/856,448

(22) Filed: Apr. 4, 2013

(65) Prior Publication Data
US 2013/0222011 A1      Aug. 29, 2013

Related U.S. Application Data

(63) Continuation of application No. 13/484,639, filed on May 31, 2012, now Pat. No. 8,432,186.

(30) Foreign Application Priority Data

Feb. 13, 2012   (JP) ................. 2012-028947

(51) Int. Cl.
*H03K 19/173*   (2006.01)
*H03K 19/0185*   (2006.01)

(52) U.S. Cl.
CPC .... *H03K 19/018585* (2013.01); *H03K 19/1737* (2013.01)
USPC ............................ 326/38; 326/41

(58) Field of Classification Search
USPC ....................................... 326/37–41
See application file for complete search history.

(56) References Cited

U.S. PATENT DOCUMENTS

| | | | |
|---|---|---|---|
| 5,812,450 | A | 9/1998 | Sansbury et al. |
| 6,002,610 | A | 12/1999 | Cong et al. |

(Continued)

FOREIGN PATENT DOCUMENTS

| | | |
|---|---|---|
| JP | H11-345496 | 12/1999 |
| JP | 2003-198361 | 7/2003 |
| JP | 2005-303990 | 10/2005 |

OTHER PUBLICATIONS

Kita, K. et al., "Intrinsic Origin of Electric Dipoles Formed at High-k/SiO$_2$ Interface," Proceedings of IEEE International Electron Devices Meeting, 4 Sheets, (2008).

Eitan, B. et al., "NROM: A Novel Localized Trapping, 2-Bit Nonvolatile Memory Cell," IEEE Electron Device Letters, vol. 21, No. 11, pp. 543-545, (2000).

(Continued)

*Primary Examiner* — Don Le
(74) *Attorney, Agent, or Firm* — Finnegan, Henderson, Farabow, Garrett & Dunner, L.L.P.

(57) ABSTRACT

One embodiment provides a programmable logic switch in which a first nonvolatile memory and a second nonvolatile memory are formed in the same well, and in which to change the first nonvolatile memory from an erased state to a written state and leave the second nonvolatile memory being in the erased state, a first write voltage is applied to a first line connected with gate electrodes of the first and second nonvolatile memories, a second write voltage is applied to a second line connected to a source in the first nonvolatile memory, and a third write voltage lower than the second write voltage is applied to a fourth line connected to a source of the second nonvolatile memory.

23 Claims, 8 Drawing Sheets

(56) References Cited

U.S. PATENT DOCUMENTS

| | | |
|---|---|---|
| 6,356,478 B1 | 3/2002 | McCollum |
| 6,970,383 B1 * | 11/2005 | Han et al. .................. 365/185.28 |
| 8,110,865 B2 | 2/2012 | Tanaka et al. |
| 8,139,410 B2 | 3/2012 | Ogura et al. |
| 2013/0215670 A1 | 8/2013 | Oda et al. |

OTHER PUBLICATIONS

Nishi, Y. et al., "Nonvolatile Programmable Logic Switch," U.S. Appl. No. 13/240,087, filed Sep. 22, 2011.

Office Action in corresponding Japanese Application No. 2012-028947 dated May 9, 2014 and partial English translation. (4 pages).

* cited by examiner

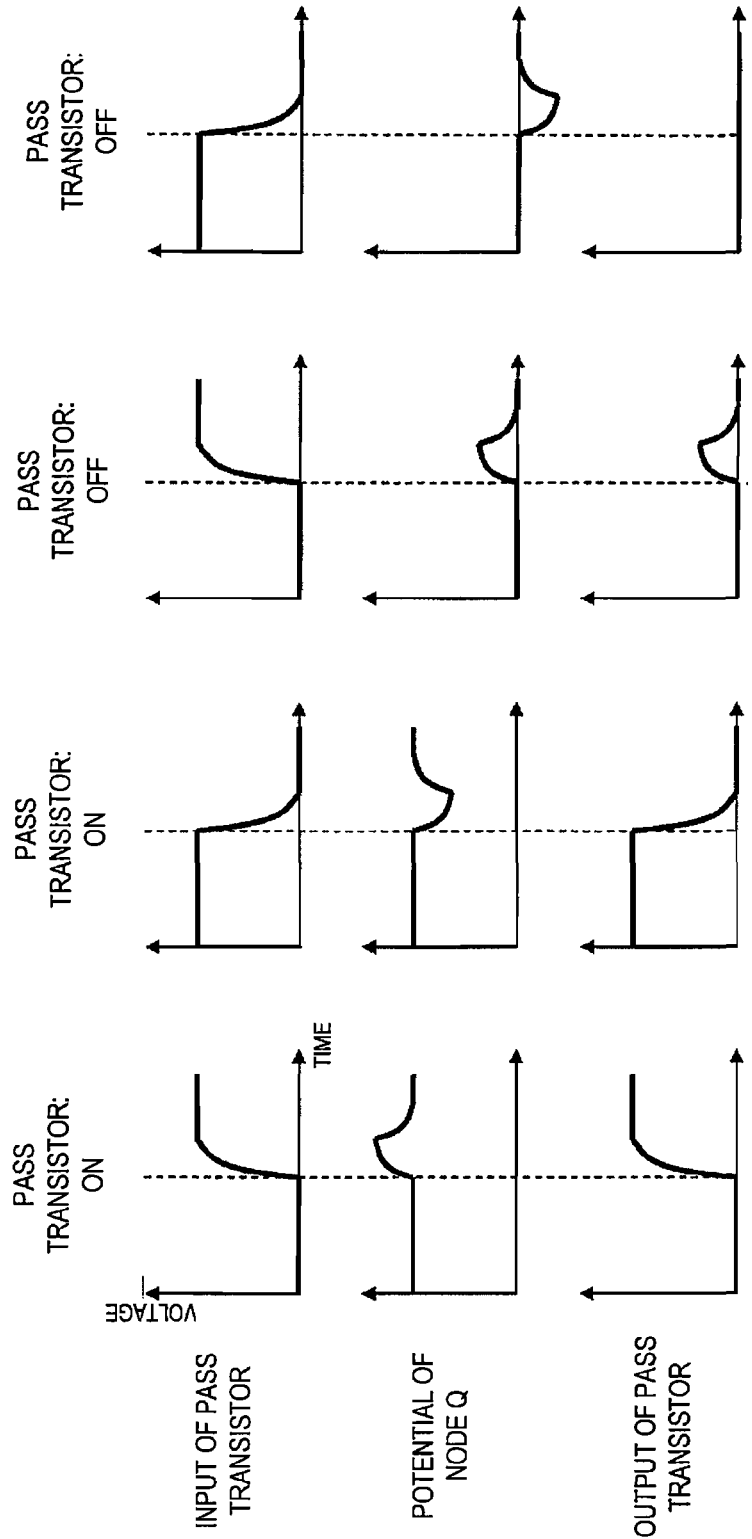

PROGRAMMABLE LOGIC SWITCH

CROSS-REFERENCE TO RELATED APPLICATION(S)

This is a continuation of application Ser. No. 13/484,639, filed May 31, 2012, which is incorporated herein by reference.

This application claims priority from Japanese Patent Application No. 2012-028947 filed on Feb. 13, 2012, the entire contents of which are incorporated herein by reference.

FIELD

Embodiments described herein relate generally to a programmable logic switch.

BACKGROUND

Programmable logic switches are devices for on/off-controlling logic switches (e.g., transistors) according to data that are held by a memory. In general, programmable logic switches are used for, for example, programmable logic devices such as FPGAs (field programmable gate arrays) in which logic operational circuits or interconnection circuits need to be reconfigured. For example, such programmable logic device includes plural wirings and a connection unit (plural connection units) for switching connection/disconnection of these wirings. The programmable logic switches may be used in such connection unit.

Programmable logic switches that are used in conventional FPGAs employ a volatile memory such as an SRAM. Therefore, the data stored in the memory are lost when the power is shut off. This means a problem that data need to be read from a separately provided memory area when the power is turned on again. In general, each cell of an SRAM is composed of six transistors, which raises a problem that the chip area of an FPGA increases as the number of SRAM cells used therein increases.

Programmable logic switches that employ a nonvolatile flash memory are known as devices capable of solving this problem. Each memory cell of an FPGA disclosed in U.S. Pat. No. 6,002,610-B includes a first nonvolatile memory device and a second nonvolatile memory device which are connected to each other in series. The gates of the first nonvolatile memory device and the second nonvolatile memory device are connected to a common line (control voltage line). A connecting point of the first nonvolatile memory device and the second nonvolatile memory device acts as an output node Q of the memory cell. A switching transistor of the programmable logic switch and an n-MOS transistor are connected to the output node Q of the memory cell. While the memory cell is in an operation mode, one of the first nonvolatile memory device and the second nonvolatile memory device is in an erased state and the other is in a written state. A voltage 0 V is applied to the source of one of the first nonvolatile memory device and the second nonvolatile memory device, and a power supply voltage (e.g., 3 V) is applied to the source of the other nonvolatile memory device. As a result, the switching transistor is made on or off depending on which of the first nonvolatile memory device and the second nonvolatile memory device is in a written state.

While the memory cell is in a programming mode, a first write voltage (7 V) is applied to the gates of the first and second nonvolatile memory devices, a second write voltage (4 V) is applied to the source of one, to be rendered into a written state, of them, and 0 V is applied to the source of the other. At this time, the n-MOS transistor is turned on and 0 V is applied to the node Q via the n-MOS transistor. As a result, a potential difference occurs between the source and the drain of a nonvolatile memory device to be rendered into a written state and data is written to it.

While the memory cell is in an erasing operation mode, a first erase voltage (−6 V) is applied to the gates of the first and second nonvolatile memory devices and 0 V is applied to the sources of the first and second nonvolatile memory devices. At this time, the n-MOS transistor is turned on and a second erase voltage (4 V) is applied to the node Q via the n-MOS transistor. As a result, the potential difference between the drain and the gate of the first nonvolatile memory device and that of the second nonvolatile memory device are 10 V. Electrons are pulled out of the storage films of the two nonvolatile memory devices using these potential differences.

However, each memory cell of the FPGA disclosed in U.S. Pat. No. 6,002,610-B has the following problems. First, to enable writing to only one nonvolatile memory device, each memory cell is provided with the n-MOS transistor. This results in increase in chip area and chip cost. Second, to apply a power supply voltage to the gate of the switching transistor of a memory cell, it is necessary to charge up also the drain junction capacitance of the n-MOS transistor, which results in increase in voltage transmission time, that is, reduction in memory cell operation speed. Third, while a memory cell is in the erasing operation mode, a second erase voltage (4 V) is applied to the gate of the switching transistor from the node Q. Since the substrate voltage of the switching transistor is 0 V, the gate insulating film of the switching transistor should be thick enough not to be broken when the second erase voltage is applied to its gate. Where a high second erase voltage is used for erasing data from the nonvolatile memory devices, the gate insulating film of the switching transistor is made thick and the operation speed of the switching transistor is thereby lowered. Fourth, different voltages are applied to the source of the n-MOS transistor while each memory cell is in the erasing operation mode and while it is in the programming mode. Furthermore, to turn on the n-MOS transistor, the potential difference between its source and gate need to be set higher than or equal to the threshold voltage Vth. Therefore, it is necessary to apply different voltages to the gate of the n-MOS transistor in the erasing operation mode and in the programming mode. Thus, power sources of such plural voltages are necessary.

BRIEF DESCRIPTION OF DRAWINGS

A general architecture that implements the various features of the present invention will now be described with reference to the drawings. The drawings and the associated descriptions are provided to illustrate embodiments and not to limit the scope of the present invention.

FIGS. 14A-14D show how each cell of a logic switch according to a second embodiment operates.

DETAILED DESCRIPTION

In general, one embodiment provides a programmable logic switch including: a first nonvolatile memory having: a first channel region provided between a first source and a first drain; a first insulating film formed on the first channel region; a first charge storage film formed on the first insulating film; a second insulating film formed on the first charge storage film; and a first gate electrode formed on the second insulating film; a second nonvolatile memory having: a second channel region provided between a second source and a second drain; a third insulating film formed on the second channel region; a second charge storage film formed on the third insulating film; a fourth insulating film formed on the second charge storage film; and a second gate electrode formed on the fourth insulating film; a first line connected to the first gate electrode and to the second gate electrode; a second line connected to the first source; a third line connected to the first drain and to the second drain; a fourth line connected to the second source; a substrate electrode through which a substrate voltage is applied to a well, the first nonvolatile memory and the second nonvolatile memory being formed in the well; one or more first logic transistors connected to the third line, each first logic transistor being connected to the third line at a gate electrode thereof; and a controller configured to connect, to change the first nonvolatile memory from an erased state to a written state and leave the second nonvolatile memory being in the erased state, a first write voltage to the first line, a second write voltage to the second line, and a third write voltage lower than the second write voltage to the fourth line, wherein no logic transistor other than the first logic transistors is connected to the third line.

Embodiment 1

Figure 1:
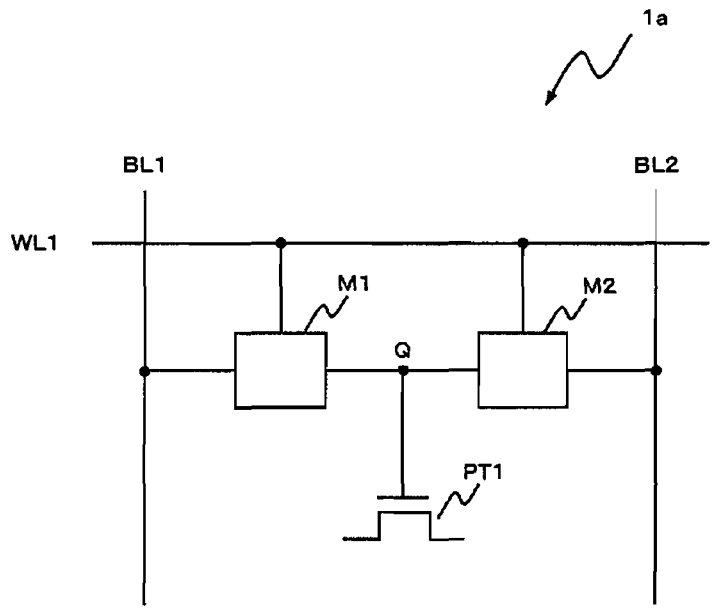
FIG. 1 shows one cell of a logic switch according to a first embodiment.

A first embodiment of the present invention will be hereinafter described with reference to the drawings. FIG. 1 shows one cell of 1a a programmable logic switch (hereinafter referred to as a logic switch) according to the first embodiment. The cell 1a of the logic switch according to the embodiment is equipped with two nonvolatile memories M1 and M2 and one pass transistor PT1. Each of the nonvolatile memories M1 and M2 has at least two signal electrodes and a control electrode and its memory state is switched by respective signals that are input to the signal electrodes and the control electrode. One ends of the nonvolatile memories M1 and M2 are connected to a node Q and their control electrodes are both connected to a word line WL1. The nonvolatile memories M1 and M2 are connected to respective bit lines BL1 and BL2. The gate of the pass transistor PT1 is connected to the node Q.

In the cell 1a, data can be written to one of the nonvolatile memories M1 and M2 by adjusting the magnitudes and application timing of voltages that are applied to the word line WL1 and the bit lines BL1 and BL2. The data stored in the nonvolatile memories M1 and M2 can be erased from them together. The nonvolatile memories M1 and M2 are flash memory transistors or 3-terminal nonvolatile MEMS switches, for example. The following description will be made of a case that the nonvolatile memories M1 and M2 are flash memory transistors having a charge storage film.

Figure 2:
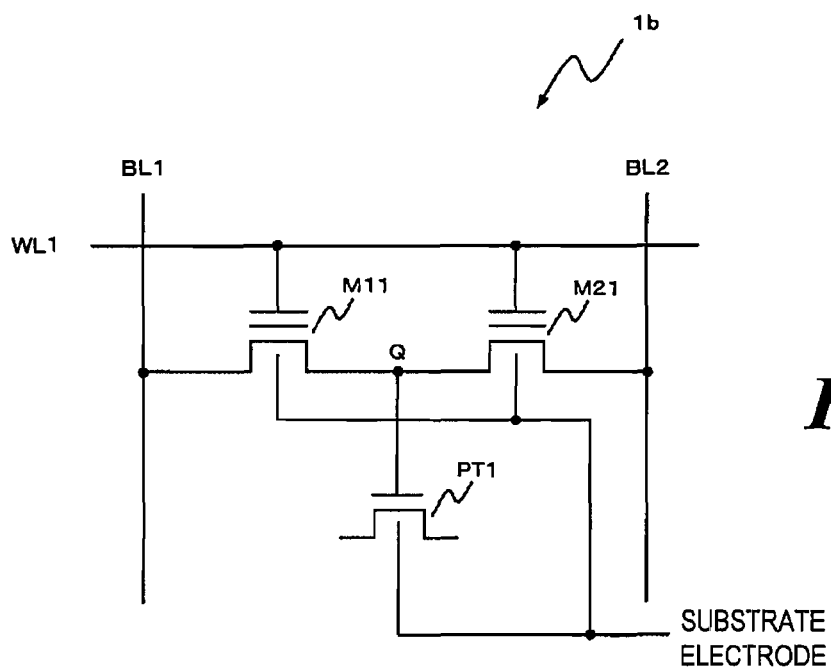
FIG. 2 shows one example cell of the logic switch according to the first embodiment.

FIG. 2 shows a cell 1b of a logic switch in which flash memory transistors (hereinafter referred to as memory transistors) M11 and M21 are used as the nonvolatile memories M1 and M2. That is, the cell 1b has the two memory transistors M11 and M21 and one pass transistor PT1. While each of the memory transistors M11 and M21 have a memory function, the pass transistor PT1 does not have memory function. The transistor having no memory function may be referred to as a logic transistor. Generally, in the logic transistor, a gate insulating film is thin (a distance between a substrate to a gate electrode is short), and the thickness thereof is about 5 nm or less. Contrary, in the memory transistor, a distance between a substrate to a gate electrode measures 10 nm or more due to the presence of a charge storage film therebetween.

The memory transistors M11 and M21 may be FG (floating gate) transistors in which a conductive floating gate is used as a charge storage film or MONOS (metal-oxide-nitride-oxide-semiconductor) transistors in which an insulative silicon nitride or oxynitride film is used as a charge storage film. Where the memory transistors M11 and M21 are MONOS transistors, because of process compatibility, the memory transistors M11 and M21 can be disposed closer to logic transistors such as the pass transistor PT1 than in the case where the memory transistors M11 and M21 are FG transistors, thereby reducing the chip area. In the embodiment, it is assumed that the memory transistors M11 and M21 are MONOS transistors in which a silicon nitride film is used as a charge storage film.

Figure 3:
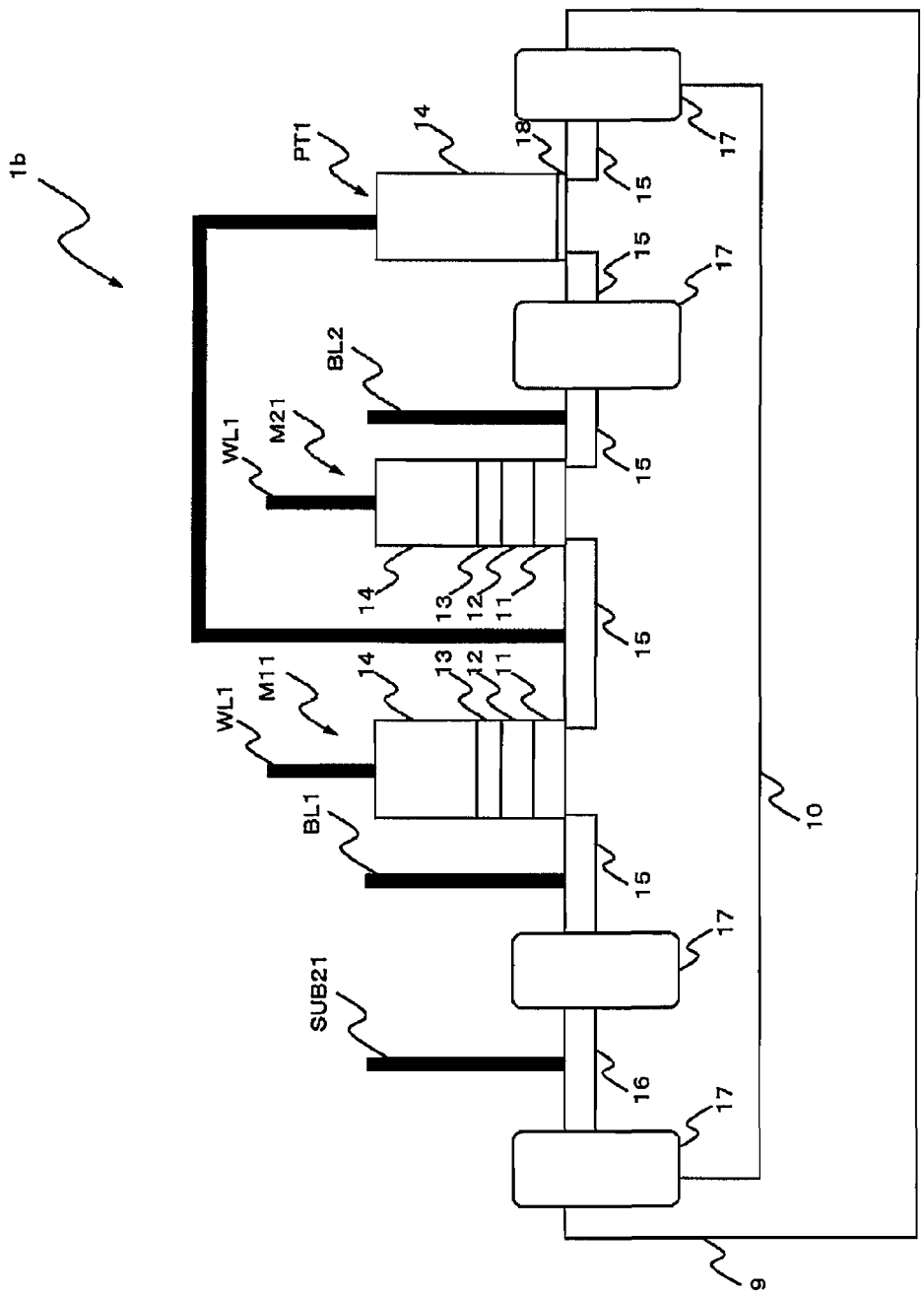
FIG. 3 shows an example sectional structure of each cell of the logic switch according to the first embodiment.

FIG. 3 shows an example sectional structure of the cell 1b. As shown in FIG. 3, the memory transistors M11 and M21 and the pass transistor PT1 are formed in the same well 10 and the well 10 is formed with a substrate electrode 16 for application of a substrate voltage. Each of the memory transistors M11 and M21 is a MONOS transistor having a gate structure which is a stack of a silicon oxide film (first insulating film) 11 formed on a channel region of a silicon substrate 9, silicon nitride film (charge storage film) 12 formed on the first insulating film 11, a silicon oxide film (second insulating film) 13 formed on the charge storage film 12, and a control gate electrode 14 formed on the second insulating film 13.

As shown in FIGS. 2 and 3, the gates of the memory transistors M11 and M21 are both connected to the word line WL1. One of source/drain electrodes 15 of the memory transistor M11 is connected to the bit line BL1 and the other is connected to one of source/drain electrodes 15 of the memory transistor M21. The other source/drain electrode 15 of the memory transistor M21 is connected to the bit line BL2. The connection node Q of the memory transistors M11 and M21 is connected to the gate of the pass transistor PT1.

Although in the embodiment the memory transistors M11 and M21 are n-type transistors formed in the p-type well 10, they may be p-type transistors formed in an n-type well. Although as shown in FIG. 3 the memory transistors M11 and M21 are formed in the same active area (hereinafter abbreviated as AA) which is enclosed by a device isolation layer 17, they may be formed in different active areas. Although in the embodiment the substrate 9 is made of silicon, the substrate may be made of another semiconductor. Furthermore, each of the first insulating film 11, the charge storage film 12, the second insulating film 13, and the control gate electrode 14 may be formed by laying plural, different kinds of films.

(Writing Method)

A method for writing data to the memory transistors M11 and M21 of the cell 1b will be described below with reference to FIGS. 4-6. In the following, a written state of each of the memory transistors M11 and M21 is defined as a state that a large amount of electrons are stored in the charge storage film 12 of the memory transistor M11 or M21 and hence its threshold voltage Vth is increased. An erased state is defined as a state that only a small number of electrons are stored in the charge storage film 12 and hence its threshold voltage Vth is lowered. It is assumed that the threshold voltage Vth of each of the memory transistors M11 and M21 is 2 V in an erased state and 6 V in a written state.

In the embodiment, CHEs (channel hot electrons) are used for writing data to each of the memory transistors M11 and M21. CHEs, which have extremely high energy, are produced when the drain voltage of a transistor has become higher than a certain value and the channel has been pinched off at its drain-side end. Writing to a memory transistor is realized by pulling CHEs produced by a source/drain potential difference into a charge storage film by a gate voltage. The writing method using CHEs is advantageous over a writing method using a FN (Fowler-Nordheim) current in that voltages applied to the individual terminals are small.

Figure 4A:
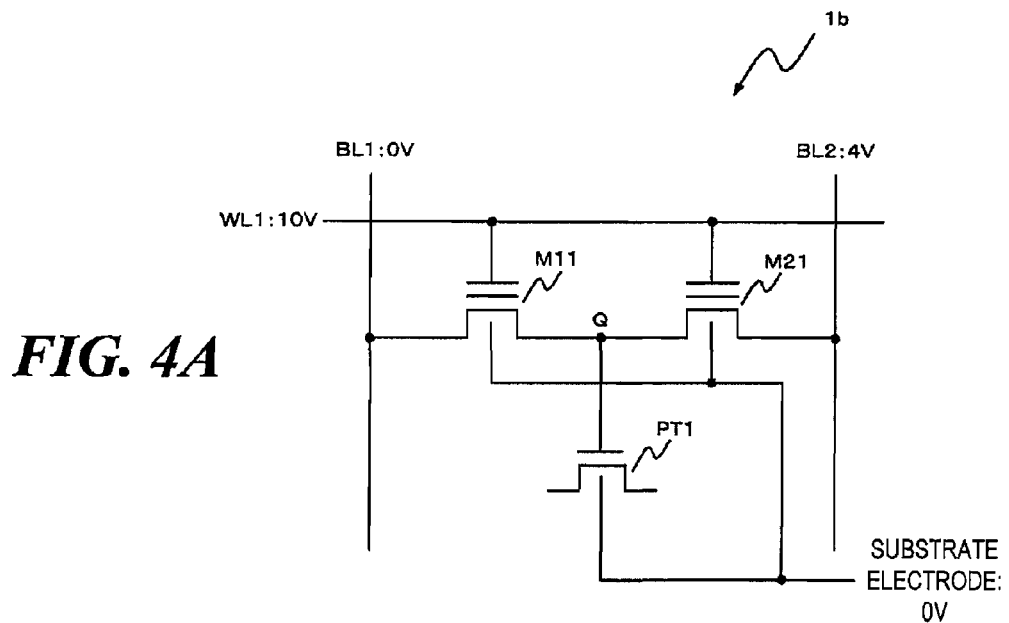
FIGS. 4A and 4B illustrating selective writing to a memory transistor in each cell of the logic switch according to the first embodiment.

To write data to only the memory transistor M21 when both of the memory transistors M11 and M21 are in an erased state, as shown in FIG. 4A a first write voltage is applied to the word line WL1 and a second write voltage is applied to the second bit line BL2. A ground voltage is applied to the bit line BL1 and the substrate electrode. For example, in order to apply these voltages to the respective line/electrode, a controller (plural controllers) configured to selectively connect these voltages to the respective line/electrode may be provided.

The first write voltage is set at a voltage that is higher than the threshold voltage Vth of the memory transistors M11 and M21 being in an erased state and lower than a voltage at which writing to a memory transistor is performed using an FN current. More specifically, to write data to a memory transistor using an FN current, a voltage of about 20 V is necessary. Therefore, the first write voltage is set lower than 20 V.

The second write voltage is set higher than the height of a barrier between silicon and the silicon oxide film 11. This is because CHEs produced at the drain-side end of the channel of the memory transistor M21 are required to enter the silicon nitride film (charge storage film) 12 going over the energy barrier of the silicon oxide film (tunnel film) 11. The second write voltage is set at such a voltage the pn junctions between the p-type well 10 and the n-type source/drain diffusion layers 15 of the memory transistor M21 are not broken.

In the embodiment, for example, the first write voltage is set at 10 V and the second write voltage is set at 4 V. However, the first write voltage and the second write voltage are not limited to these voltages; they may be the same voltage or the second write voltage may be higher than the first write voltage.

Figure 4B:
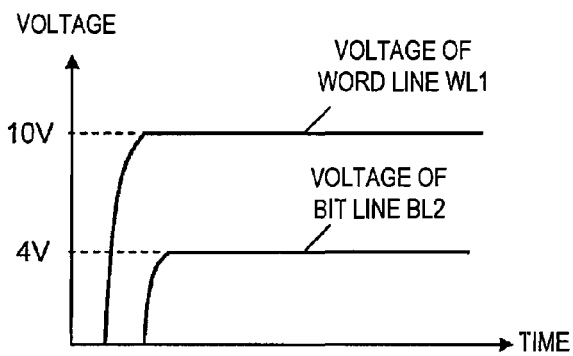

FIG. 4B shows application timing of the first write voltage and the second write voltage. In the embodiment, as shown in FIG. 4B, the first write voltage is applied to the word line WL1 before the second write voltage is applied to the bit line BL2.

The above-described writing method enables selective writing to a memory transistor while preventing destruction of the gate of the pass transistor PT1 by the write voltages. First, the principle that enables selective writing to a memory transistor will be described.

When the first write voltage (e.g., 10 V) is applied to the word line WL1, the memory transistors M11 and M21 are both turned on. Since the first write voltage is lower than a voltage that is necessary for writing using an FN current, data is written to neither of the memory transistors M11 and M21 merely by application of the first write voltage to the word line WL1.

Then, the second write voltage (e.g., 4 V) is applied to the bit line BL2. As a result, a difference occurs between the gate-source voltage (hereinafter referred to as a drive voltage) of the memory transistor M11 and that of the memory transistor M21. Whereas the drive voltage of the memory transistor M11 is 10 V, the drive voltage of the memory transistor M21 is 6 V. In general, the channel resistance of a transistor becomes smaller as the drive voltage is increased. Therefore, the channel resistance of the memory transistor M11 becomes smaller than that of the memory transistor M21 which is connected to the bit line BL2.

The potential VQ of the node Q is given by $$VQ = \{R1/(R1+R2)\} \times (VBL2 - VBL1)$$

where R1 is the channel resistance of the memory transistor M11, R2 is the channel resistance of the memory transistor M21, and VBL1 and VBL2 are the voltages applied to the bit lines BL1 and BL2, respectively. Since R1<R2, the potential VQ is lower than (VBL2−VBL1)/2. That is, the potential VQ is closer to VBL1 than to VBL2 and hence the source-drain voltage of the memory transistor M21 is higher than that of the memory transistor M11.

As mentioned above, CBEs are produced when the channel has been pinched off at its drain-side end. Increasing the source-rain voltage of a memory transistor gradually, pinch-off occurs when it exceeds a certain voltage (hereinafter referred to as VDsat). Once pinch-off has occurred, the drain current of the memory transistor is saturated.

Figure 5:
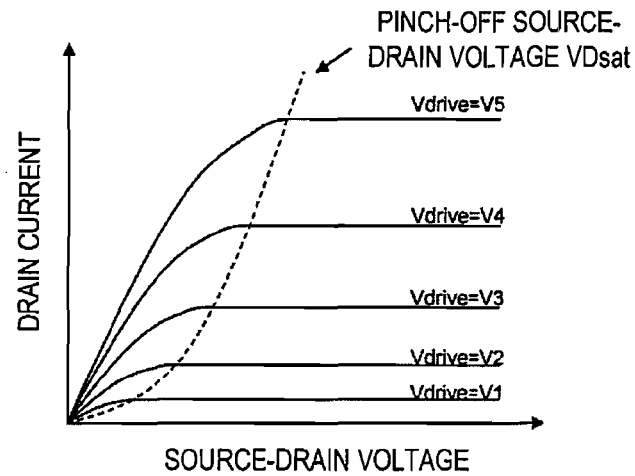
FIG. 5 is a graph illustrating selective writing to a memory transistor in each cell of the logic switch according to the first embodiment.

FIG. 5 shows relationships between the source-drain voltage and the drain current of a memory transistor for five drive voltages Vdrive. As shown in FIG. 5, the five drive voltages have a relationship V1<V2<V3<V4<V5. A broken line connects the pinch-off source-drain voltages VDsat at which the channel is pinched off. In general, VDsat increases as the drive voltage becomes higher. Since as mentioned above the drive voltage of the memory transistor M11 is higher than that of the memory transistor M21, the pinch-off source-drain voltage of the memory transistor M11 is higher than that of the memory transistor M21. However, the source-drain voltage of the memory transistor M11 is lower than that of the memory transistor M21. Therefore, whereas in the memory transistor M21 the channel is pinched off and data is written to it using CHEs, in the memory transistor M11 the source-drain voltage does not reach the pinch-off voltage and data is not written to it using CHEs.

Figure 6:
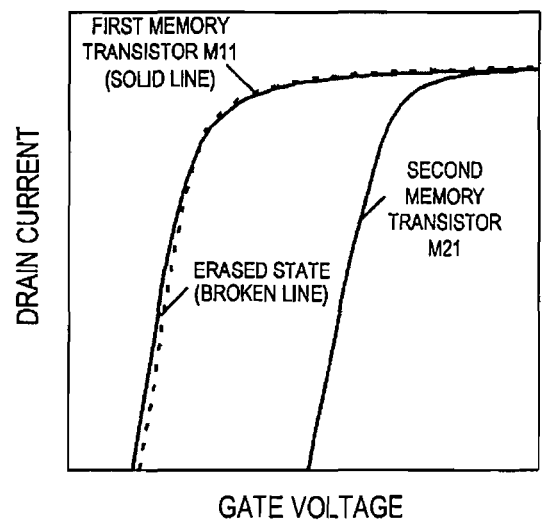
FIG. 6 is a graph showing a result of experiment which confirms that selective writing to a memory transistor can be performed in each cell of the logic switch according to the first embodiment.

FIG. 6 is a graph showing a result of an experiment which confirmed, in a device having the cell 1b of FIG. 2, that selective writing to a memory transistor can be performed by the writing method according to the embodiment. In FIG. 6, the broken line indicates a characteristic of a memory transistor M11 being in an erased state. The experiment used two memory transistors M11 and M21 having the same device parameters therefore they had the same electrical characteristics when both of them were in an erased state. In FIG. 6, the solid lines indicate how the two memory transistors M11 and M21 operated when writing was performed by the method shown in FIGS. 4A and 4B on the cell 1b including the two memory transistors M11 and M21. As shown in FIG. 6, when writing was performed by the method shown in FIGS. 4A and 4B, the threshold voltage Vth of the memory transistor M11 did not vary and only the threshold voltage Vth of the memory transistor M21 increased. That is, data was written to the selected memory transistor M21 successfully.

Next, a description will be made of the principle on which gate destruction of the pass transistor PT1 by a write voltage is prevented. To realize a high-speed logic switch, it is desirable that the thickness of the gate insulating film of the pass transistor PT1 be several nanometers. It is presumed that the breakdown voltage of such a gate insulating film is about 2 V. Therefore, if the potential of the node Q is made higher than or equal to 2 V, gate destruction may occur in the pass transistor PT1.

In the writing method according to the embodiment, the drive voltage during writing is higher in the memory transistor M11 than in the memory transistor M21. Therefore, the potential VQ of the node Q is almost equal to 0 V and a stable state is established in a state that the gate of the pass transistor PT1 receives almost no voltage.

Figure 7:
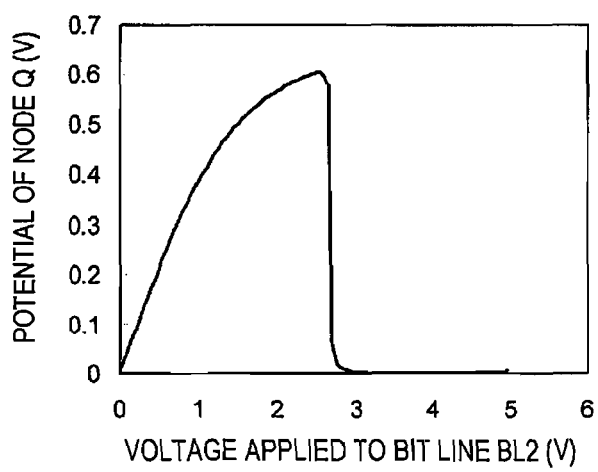
FIG. 7 is a graph showing a relationship between the potential of a node Q and the voltage applied to a bit line BL2 in each cell of the logic switch according to the first embodiment.

FIG. 7 is a graph showing how the potential VQ of the node Q varies when the voltage VBL2 applied to the bit line BL2 is varied in a state that 10 V is applied to the word line WL1 of the cell 1b shown in FIG. 2. When the voltage VBL2 is lower than or equal to 1 V, the curve is almost linear and has a slope that is smaller than 0.5. This means that the channel resistance R1 of the memory transistor M11 is smaller than the channel resistance R2 of the memory transistor M21. When the voltage VBL2 is increased further, the potential VQ drops to approximately 0 V and then remains at that level. This means that pinch-off occurs in the memory transistor M21, data is written to the memory transistor M21 by resulting CHEs, and the channel resistance R2 of the memory transistor M21 increases very much.

According to the writing method of the embodiment, the potential VQ can be made equal or close to 0 V and there is no probability that a high voltage (about 2 V) that may cause gate destruction is applied to the pass transistor PT1. Therefore, the pass transistor PT1 can be designed such that its gate insulating film is sufficiently thin, thereby realizing a logic switch capable of high-speed operation.

In the embodiment, as shown in FIG. 4B, the first write voltage is applied to the word line WL1 before the second write voltage is applied to the bit line BL2. If the second write voltage is applied to the bit line BL2 when the word line WL1 is at 0 V or in a floating state, no difference occurs between the channel resistance R1 of the memory transistor M11 and the channel resistance R2 of the memory transistor M21 and the potential VQ may become higher than or equal to the breakdown voltage of the pass transistor PT1. Furthermore, if the threshold voltage Vth of the memory transistor M21 in an erased state is made lower than the threshold voltage Vth of the memory transistor M11 in an erased state due to, for example, variations in manufacture, the channel resistance R2 of the memory transistor M21 becomes smaller than the channel resistance R1 of the memory transistor M11. In this case, when the second write voltage is applied to the bit line BL2, the potential VQ is made close to the voltage VBL2 and the gate of the pass transistor PT1 may be broken.

Figure 8:
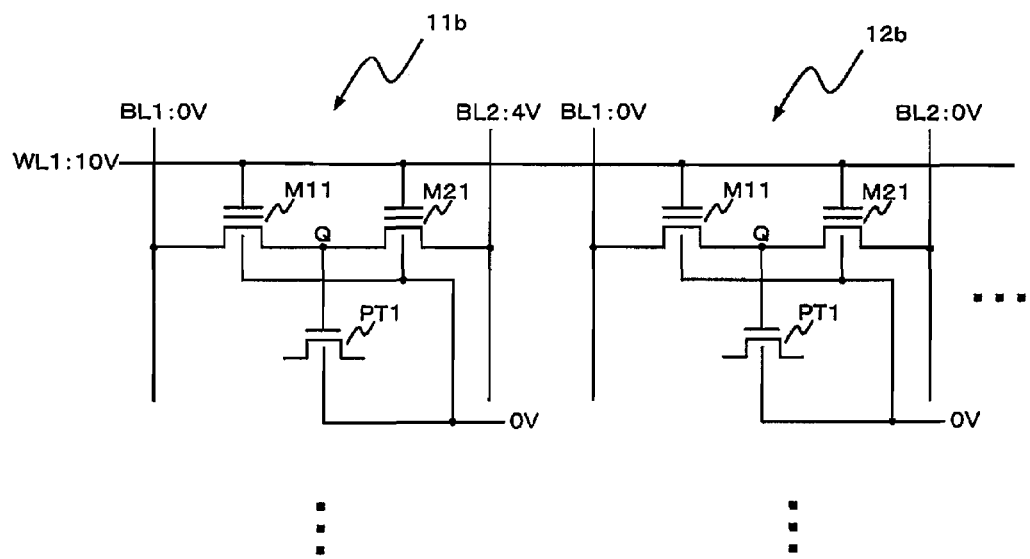
FIG. 8 shows an example cell array of the logic switch according to the first embodiment.

In contrast, where the first write voltage is applied to the word line WL1 before the second write voltage is applied to the bit line BL2, a difference necessarily exists between the drive voltages of the memory transistors M11 and M21 when the second write voltage is applied to the bit line BL2. The difference between the drive voltages is sufficiently larger than the threshold voltage variation of the memory transistors M11 and M21. Therefore, when the second write voltage is applied to the bit line BL2, there does not occur an event that the potential VQ becomes close to the voltage VBL2 unexpectedly and a high voltage beyond expectation is applied to the pass transistor PT1.

Where cells according to the embodiment are arranged in array form, plural cells are connected to the same word line as shown in FIG. 8. To prevent writing to the other cells (e.g., cell 12b) connected to the same word line in writing data to one cell (e.g., cell 11b), the potentials of the bit lines BL1 and BL2 of each of the other cells are set identical. With this measure, no CBEs are produced and writing is not done in each of the other cells.

According to the embodiment, it is not necessary to add new devices in each cell for the purpose of performing selective writing to a memory transistor or preventing destruction of the gate insulating film of the pass transistor. The memory transistors included in each cell are connected to a single word line. Therefore, the embodiment makes it possible to realize a programmable logic switch which is small in chip area and in which selective writing to a memory transistor is possible and a high voltage is not applied to the pass transistor when data is written to a memory transistor.

Figure 9:
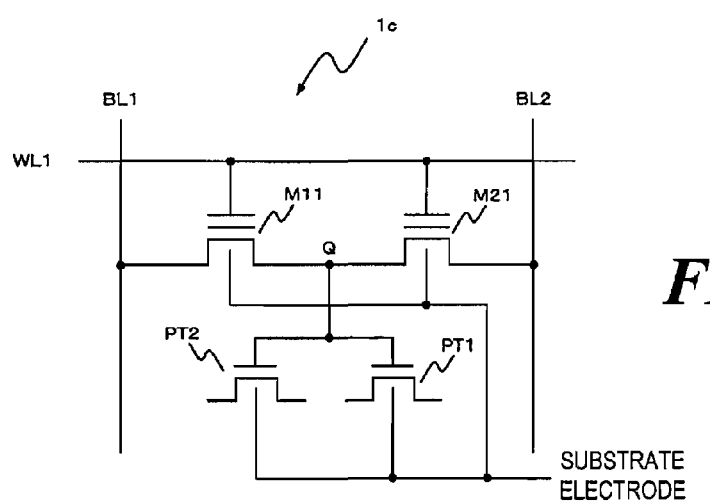
FIG. 9 shows another example cell of the logic switch according to the first embodiment.

In each cell according to the embodiment, plural pass transistors may be connected to the node Q as shown in FIG. 9. The node Q may be connected to the input terminal of an inverter. In either case, the control gate electrodes of the path transistors or the transistors constituting the inverter are connected to the node Q.

Although the above description is directed to the method for writing data to the main transistor M21, data can be written to the memory transistor M11 by the same method. In writing data to the memory transistor M11, the second write voltage is applied to the bit line BL1 and the ground voltage is applied to the bit line BL2.

Although in the above description the ground voltage is applied to the bit line BL1 and the substrate electrode, a third write voltage which is a negative voltage may be applied. It is expected that the electron injection efficiency can be increased and the first write voltage can be reduced by setting the well potential of the memory transistors negative. However, in this case, it is necessary to take care so that the gate insulating film of the pass transistor PT1 is not broken. Since during writing the potential of the node Q is approximately equal to the voltage VBL1, it is necessary that the difference between the voltage VBL1 and the third write voltage be smaller than the breakdown voltage of the gate insulating film of the pass transistor PT1. The electrical load on the gate insulating film of the pass transistor PT1 can be minimized by applying the third write voltage also to the bit line BL1. The voltages applied to the bit line BL1 and the substrate electrode may be either identical to or different from each other.

(Erasing Method)

Figure 10:
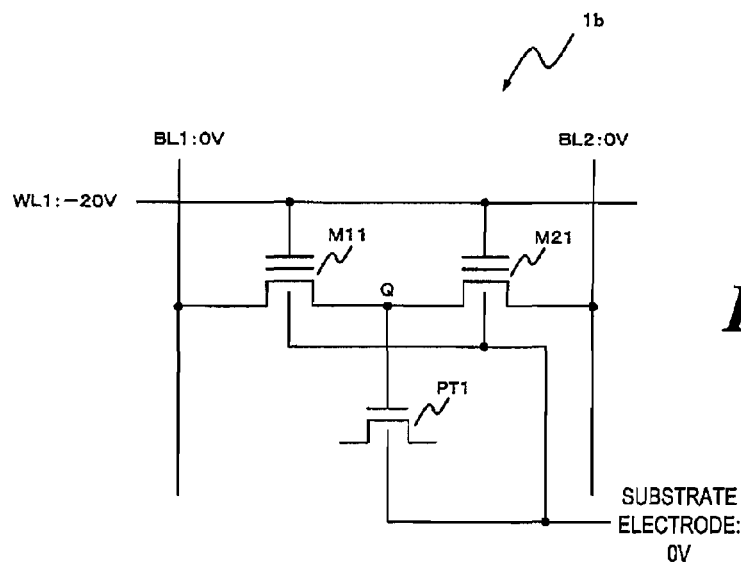
FIG. 10 illustrates an operation of erasing data from the memory transistors of each cell of the logic switch according to the first embodiment.

A method for erasing data from the memory transistors in the embodiment will be described below with reference to FIG. 10. To erase data from the memory transistors, a negative erase voltage is applied to the word line WL1 in a state that 0

V is applied to the substrate electrode. Since the erasing method according to the embodiment uses an FN current, the erase voltage is equal to −20 V, for example. According to this erasing method, data is erased from both memory transistors M11 and M21 included in a cell. And data is erased from all of the memory transistors connected to the same word line. The pass transistor PT1 is not damaged at the time of erasure because the substrate potential is set to 0 V.

When the negative erase voltage is applied to the word line WL1, it is expected that the potential VQ of the node Q is modulated in the negative direction due to the gate-drain capacitive coupling of the memory transistors M11 and M21. However, when the potential VQ is made lower than the substrate potential, currents flow through the pn junctions of the well (doped with a p-type impurity) and drain diffusion layers (doped with a n-type impurity) of the memory transistors M11 and M21, whereby the potential VQ comes to be equal to the substrate potential immediately. Therefore, there does not occur an event that a high voltage is applied to the pass transistor PT1 due to the capacitive coupling when the erase voltage is applied to the word line WL1.

Another method for erasing data from the memory transistors M11 and M21 is conceivable in which a positive erase voltage (e.g., about 20 V) is applied to the substrate electrode and 0 V is applied to the word line WL1. However, in the embodiment, the memory transistors M11 and M21 and the pass transistor PT1 are formed in the common well. The erase voltage that is applied to the memory transistors M11 and M21 is also applied to the pass transistor PT1 simultaneously and is output from the source or drain of the pass transistor PT1 through the source-well or drain-well pn junction of the pass transistor PT1. The source and the drain of the pass transistor PT1 may be connected to another logic circuit (e.g., the input or output of an inverter), and it is desirable that for high-speed operation the gate insulating films of the transistors constituting the other logic circuit be thin. If the high erase voltage that is output from the pass transistor PT1 is applied to transistors of the other logic circuit, their gate insulating films may be broken.

In contrast, according to the erasing method of the embodiment, the potential of the source or drain of the pass transistor PT1 is not made unduly high and a logic circuit that is connected to the pass transistor PT1 can be composed of high-speed transistors whose gate insulating films are sufficiently thin.

(Requirements about Charge Storage Film)

Where a MONOS transistor is used as each of the memory transistors M11 and M21 in the embodiment, as described later it is desirable that injected charge is distributed with a low degree of unevenness in the charge storage film 12.

In silicon nitride (SiN) which is used for forming the charge storage film 12 in the embodiment, electron trap levels vary depending on the contents of Si and N. Since the Si atom has four unpaired electrons and the N atom has three unpaired electrons, the stoichiometric mole ratio of N to Si (N/Si ratio) of SiN is 1.33 (in the following, an SiN film whose N/Si ratio is equal to 1.33 will be referred to as a stoichiometric SiN film). In an SiN film whose N/Si ratio is smaller than 1.33 (hereinafter referred to as a Si-rich SiN film), electron trap levels are shallower than in a stoichiometric SiN film and hence electrons can move relatively easily in the charge storage film 12.

Where a stoichiometric SiN film is used as the charge storage film 12, electrons that have been injected into the charge storage film 12 by writing are trapped in the film 12 in a localized manner. At the time of writing, CHEs are produced at the drain-side end of the channel of the memory transistor M11 or M21. Therefore, electrons that are injected into the charge storage film 12 by CHE writing are trapped so as to be concentrated on the drain side, as a result of which the potential profile of the channel of the memory transistor M11 or M21 may be unsymmetrical.

With the definitions that one, on the higher potential side, of the source/drain diffusion regions of an n-channel transistor is defined as a drain and the other is defined as a source, the channel resistance of the transistor is dominated by a source-side potential barrier. For example, assume that the same amount of electrons are injected into the charge storage films of two memory transistors and that more electrons are stored on the drain side in the charge storage film of one memory transistor and more electrons are stored on the source side in the charge storage film of the other memory transistor. In this case, the source potential can be modulated more strongly and the threshold voltage Vth is varied to a larger extent in the latter memory transistor (refer to IEEE Electron Device Letters, Vol. 21, pp. 543-545 (2000), for example).

Therefore, if electrons injected by CHE writing are trapped in the charge storage film 12 so as to be localized around the drain, there may occur a case that the threshold voltage Vth is not varied sufficiently, depending on the source/drain voltage application direction.

Figure 11:
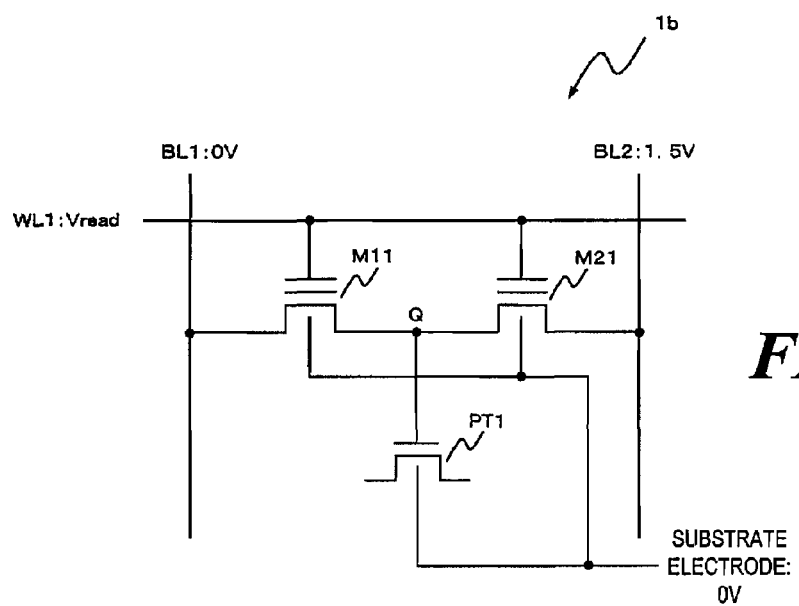
FIG. 11 shows how each cell of the logic switch according to the first embodiment operates.

If the threshold voltage Vth is not varied sufficiently, trouble may occur during operation of the logic switch. A description will be made of an example in which the logic switch is caused to operate by applying voltages to the respective lines of the cell 1b in the manner shown in FIG. 11. Assume that the memory transistor M11 is in an erased state and the memory transistor M21 is in a written state. In this state, 0 V is applied to the gate of the pass transistor PT1 through the memory transistor M11. Under these operation conditions, the one source/drain diffusion region, connected to the node Q, of the memory transistor M21 is the source and the other source/drain diffusion region connected to the bit line BL2 is the drain. Where electrons injected by CHE writing are trapped in the charge storage film 12 so as to be localized on the drain side, the threshold voltage Vth of the memory transistor M21 is not increased sufficiently. This may result in a phenomenon that a large leakage current occurs in the memory transistor M21 to increase the power consumption or the memory transistor M21 cannot interrupt the voltage applied to the bit line BL2 to cause an erroneous operation of the logic switch.

As is understood from the above discussion, it is desirable that electrons exist also on the source side in the charge storage film 12 when data is written to the memory transistor M11 or M21. However, where a stoichiometric SiN film is used as the charge storage film 12, to cause injected electrons to exist also on the source side in the charge storage film 12, it is necessary to set the writing time long.

On the other hand, in a Si-rich SiN film, electrons can move more easily in the film than in a stoichiometric SiN film because trap levels are shallower. Therefore, where a Si-rich SiN film is used as the charge storage film 12, electrons injected into the charge storage film 12 around the drain by writing move through the charge storage film 12 to the source side. Therefore, where the logic switch is caused to operate by applying voltages to the respective lines of the cell 1b in the manner shown in FIG. 11, the threshold voltage Vth of the memory transistor M21 which is in a written state can be kept high, whereby the leakage current can be reduced and an erroneous operation of the logic switch can be prevented. Furthermore, it is not necessary to set the writing time long unlike in the case of using a stoichiometric SiN film.

Electrons in the charge storage film 12 are allowed to move more easily as the N/Si ratio decreases. However, the N/Si ratio being equal to 0.67 means a composition in which on average two of the four bonds of a Si atom are dangling bonds or form covalent bonds with adjacent Si atoms. In this case, a large amount of covalent bonds are formed, as a result of which the insulation of the SiN film is lowered and a large gate leakage current occurs. It is therefore desirable that the N/Si ratio be larger than 0.67 and smaller than 1.33. The composition of the charge storage film 12 can be known by analyzing it by electron energy-loss spectroscopy (EELS).

In a Si-rich SiN film, since trap levels are shallow, trapped electrons tend to be released from the trap levels receiving energy from heat, for example, and move to the substrate through the first insulating film 11 or to the control gate electrode 14 through the second insulating film 13. This means shortening of the data retention time of the memory transistor M11 or M21. Since more electrons move to the substrate than to the control gate electrode 14, to prevent shortening of the data retention time of the memory transistor M11 or M21 it is necessary to prevent electrons from moving from the charge storage film 12 to the substrate.

To this end, the N/Si ratio in the charge storage film 12 is varied in its thickness direction. More specifically, in the charge storage film 12, the N/Si ratio is set large near the interface with the first insulating film 11 to prevent degradation of the data retention characteristic and set small near the interface with the second insulating film 13 to facilitate movement of electrons there. With this measure, the data retention time of the memory transistor M11 or M21 can be elongated whereas a variation of the threshold voltage Vth by writing is increased. In the case of memory transistors used in a file memory, setting the N/Si ratio large near the interface with the first insulating film 11 is not permitted because of resulting elongation of the erasing time. However, in the case of the memory transistors M11 and M21 used in the programmable logic switch according to the embodiment, the frequency of rewriting is far lower than in the case of memory transistors used in a file memory. Therefore, increase of the erasing time is not a serious problem and setting the N/Si ratio large in that portion of the charge storage film 12 which is near the interface with the first insulating film 11 is very advantageous.

Although the above description is directed to the case that the charge storage film 12 is a silicon nitride film, also in the case of a silicon oxynitride film the use of a Si-rich silicon oxynitride film prevents localization of electrons in the charge storage film 12.

(Requirements about Block Film)

Where a MONOS transistor is used as each of the memory transistors M11 and M21 in the embodiment, it is desirable that a block film (which corresponds to the second insulating film 13) of each of the memory transistors M11 and M21 be made of such a material or have such a film structure as not to allow easy passage of charge. In the case of a typical flash memory, the charge storage film 12 serves for exchange of charge with the substrate and hence it is not desirable to exchange charge with the other portions (e.g., control gate electrode 14). In the embodiment in which the memory transistors M11 and M12 are used in the logic switch, injection or emission of charge into/from the charge storage film 12 from/into the control gate electrode 14 (this phenomenon is called back tunneling) may cause a problem.

For example, where SiN is used for the charge storage film 12 and only a Si-based material such as a silicon oxide ($SiO_2$) or SiN is used for the block film 13, a certain amount of electrons are unwillingly moved from the control gate electrode 14 to the charge storage film 12 at the time of erasing, resulting in obstruction of lowering of the threshold voltage Vth. As a result, the threshold voltage Vth of the memory transistor M11 or M21 being in an erased state is made higher than 0 V. To cause operation of the logic switch, the voltage (read voltage) applied to the control gate electrode 14 of the memory transistor M11 or M21 needs to be set higher than the threshold voltage Vth of the memory transistor M11 or M21 being in an erased state. That is, in this case, a positive read voltage (typically, about 4 V) needs to be applied to the control gate electrode 14.

While the logic switch is in operation, the read voltage needs to be applied to the memory transistor M11 or M21 all the time. Applying the positive read voltage to the memory transistor M11 or M21 all the time may cause erroneous writing to the memory transistor M11 or M21 being in an erased state, resulting in an erroneous operation of the logic switch. In general, where a non-volatile memory is used in a file memory, a read voltage is not applied to a non-volatile memory transistor being in a retention state. However, where a non-volatile memory is used in a logic switch as in the embodiment, the reliability of each non-volatile memory transistor needs to be assured for a long time in a state that a read voltage is applied to it all the time.

To assure high long-term reliability of the logic switch, the back tunneling should be suppressed by using, in each of the memory transistors M11 and M21, the block film 13 which does not allow easy passage of charge.

A first example of the block film 13 which does not allow easy passage of charge is a block film made of an insulative material that is higher in relative permittivity (with respect to vacuum) than SiN (relative permittivity: 7.0). Examples of such an insulative material are aluminum oxide and hafnium oxide. As the permittivity of the block film 13 increases, the electrostatic coupling between the control gate electrode 14 and the substrate becomes stronger. When the electrostatic coupling between the control gate electrode 14 and the substrate is strong, a strong electric field can develop between the control gate electrode 14 and the substrate even if the physical thickness of the block film 13 is great. As the physical thickness of the block film 13 increases, the efficiency of charge exchange between the control gate electrode 14 and the charge storage film 12 lowers. Therefore, when data is written to or erased from the memory transistor M11 or M21, back tunneling can be prevented by a thick block film 13.

By preventing back tunneling in the above manner, the threshold voltage Vth of the memory transistor M11 or M21 being in an erased state can be lowered to a negative value. Thus, the read voltage applied to the control gate electrode 14 of the memory transistor M11 or M21 while the logic switch is in operation can be set at 0 V. That is, an event that the state of the memory transistor M21 or M11 is changed because of continuous application of a non-zero read voltage during operation of the logic switch can be prevented. Furthermore, since the read voltage can be set at 0 V, it is not necessary to provide an extra power source that is dedicated to the supply of the non-zero read voltage.

For example, the threshold voltage is determined in the following manner. A voltage 50 mV is applied between the source and the drain of a transistor, and the source-drain current IDS is measured while the gate voltage is varied. The threshold voltage Vth is defined as a gate voltage that is obtained when IDS×L/W becomes 10 nA, where W and L are the channel width and the channel length of the transistor.

In each of the memory transistors M11 and M21, whereas the above-described block film 13 is used, a metal material whose work function is larger than the work function (4.05 eV) of silicon that is doped with an n-type impurity at a high concentration is used as a material of the control gate electrode 14. Examples of such a metal material are tantalum, tungsten, and titanium nitride. As the work function of the control gate electrode 14 increases, the barrier height for electrons of the block film 13 as viewed from the side of the control gate electrode 14 increases. The employment of such a metal material as the control gate electrode 14 is thus effective in preventing back tunneling in erasing data from the memory transistor M11 or M21.

Figure 12:
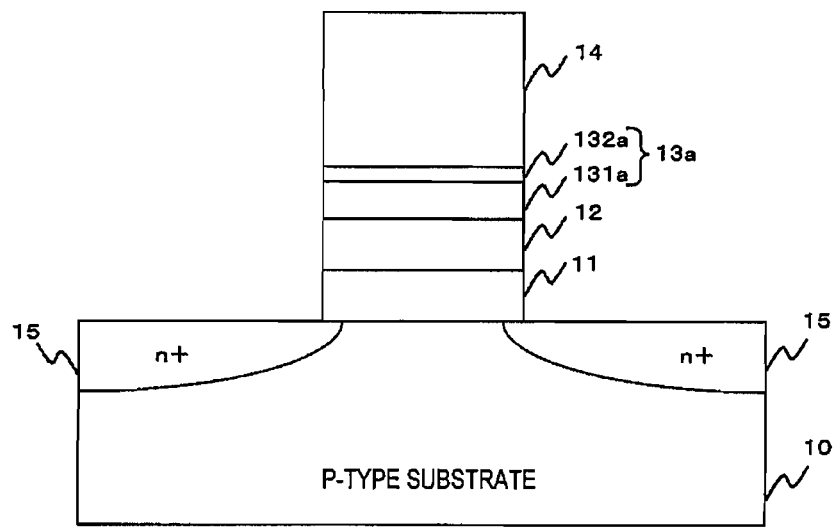
FIG. 12 shows the structure of a memory transistor having a second example block film of the logic switch according to the first embodiment.

FIG. 12 shows a second example of the block film which does not allow easy passage of charge. A block film 13*a* of a memory transistor shown in FIG. 12 includes an insulating film 131*a* which is formed on the charge storage film 12 and an insulating film 132*a* which is formed on the insulating film 131*a*. The control gate electrode 14 which is formed on the insulating film 132*a* is made of polysilicon that is doped with an n-type impurity at a high concentration. The use of the polysilicon control gate electrode 14 increases the compatibility with conventional transistor manufacturing processes and thereby enables reduction in manufacturing cost.

The insulating film 131*a* is made of an insulative material that is higher in permittivity than SiN. Examples of such an insulative material are aluminum oxide and hafnium oxide. The insulating film 132*a* is made of SiN. By forming the insulating film 131*a* with a high permittivity material, the physical thickness of the insulating film 131*a* can be increased while maintaining the strength of an electric field developing between the control gate electrode 14 and the substrate. Back tunneling is prevented by making the insulating film 131*a* thick. Furthermore, since the insulating film 132*a* made of SiN is formed over the insulating film 131*a*, an electric field in the vicinity of the interface between the insulating film 132*a* and the control gate electrode 14 is weakened when data is erased from the memory transistor and back tunneling is suppressed.

Figure 13:
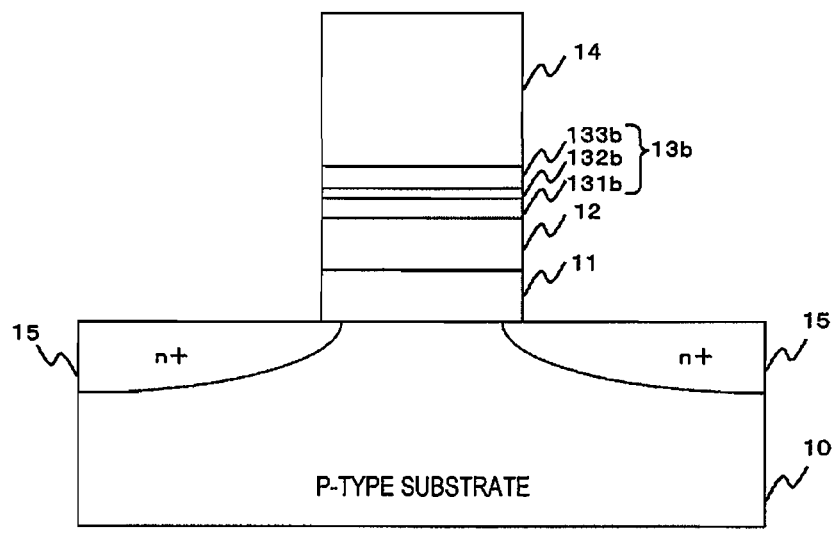
FIG. 13 shows the structure of a memory transistor having a third example block film of the logic switch according to the first embodiment.

FIG. 13 shows a third example of the block film which does not allow easy passage of charge. A block film 13*b* of a memory transistor shown in FIG. 13 includes an insulating film 131*b* which is formed on the charge storage film 12, an insulating film 132*b* which is formed on the insulating film 131*b*, and an insulating film 133*b* which is formed on the insulating film 132*b*. The control gate electrode 14 which is formed on the insulating film 133*b* is made of polysilicon that is doped with an n-type impurity at a high concentration. The insulating film 131*b* is made of $SiO_2$. The insulating film 132*b* is made of an insulative material that is higher in permittivity than SiN. Examples of such an insulative material are aluminum oxide and hafnium oxide. The insulating film 133*b* is made of SiN. The thickness of the insulating film 132*b* is 1 nm or less.

The purpose of inserting the insulating film 132*b* between the insulating films 131*b* and 133*b* is to produce electric dipoles derived from a high permittivity material and thereby increase the barrier height of the insulating film 131*b* at the interface between the insulating films 131*b* and 132*b*. This is effective in suppressing back tunneling of electrons from the control gate electrode 14 to the charge storage film 12 during an erasing operation (refer to, for example, K. Kita, "Intrinsic Origin of Electric Dipoles Formed at High-k/$SiO_2$ Interface," IEEE International Electron Devices Meeting 2008). Furthermore, since the insulating film 133*b* is formed over the insulating film 132*b*, an electric field in the vicinity of the interface between the insulating film 133*b* and the control gate electrode 14 is weakened when data is erased from the memory transistor and the influence of back tunneling is suppressed.

In this example in which the insulating film 132*b* is inserted between the insulating films 131*b* and 133*b*, the insulating film 132*b* can be made thin. Since the insulating film 132*b* can be made very thin, almost no changes from a conventional process for forming memory transistors that are made of only Si-based materials are necessary. Furthermore, since the insulating film 131*b* made of $SiO_2$ is provided between the charge storage film 12 and the insulating film 132*b* made of a high permittivity material, degradation of the memory characteristics due to diffusion of the high permittivity material into the charge storage film 12 can be prevented.

Embodiment 2

In a logic switch according to a second embodiment, the channel width W1 of one of memory transistors included in each cell is greater than the channel width W2 of the other memory transistor. The circuit diagram of each cell according to the second embodiment is the same as FIG. 2. The bit line that is connected to the memory transistor having the channel width W1 is given a ground potential at the time of operation, and the bit line that is connected to the memory transistor having the channel width W2 is given a power supply voltage at the time of operation.

The following description will be made with an assumption that the memory transistor M11 which is connected to the bit line BL1 is greater in channel width than the memory transistor M21 which is connected to the bit line BL2. In this logic switch, while it is in operation, the bit line BL1 is given the ground potential and the bit line BL2 is given the power supply voltage.

While the logic switch is in operation, to prevent an erroneous operation of the pass transistor PT1, the potential of the node Q should be fixed at the ground potential or the power supply voltage. For example, when a signal that is input to the source or drain of the pass transistor PT1 is changed from a high level (H) to a low level (L) or L to H, the potential of the node Q fluctuates due to the capacitive coupling between the source or drain and the gate.

Usually, even if the potential of the node Q fluctuates, a current flows through one, in an erased state, of the memory transistors M11 and M21 and the potential of the node Q is thereby returned to the ground potential or the power supply voltage. Since the time it takes for the potential to return to the ground potential or the power supply voltage depends on the current flowing through the memory transistor M11 or M21, it is desirable that the channel widths of the memory transistors M11 and M21 be great. However, the increase of the channel widths causes increase of the chip area.

In view of the above, how the cell 1*b* operates when the potential of the node Q fluctuates will be considered below for four situations. It is assumed that the bit line BL1 is given the ground potential and the bit line BL2 is given the power supply voltage.

FIG. 14A shows a first situation that the memory transistor M11 is in a written state, the memory transistor M21 is in an erased state, and the input signal to the pass transistor PT1 is changed from L to H. When the input signal to the pass transistor PT1 is changed from L to H, the potential of the node Q fluctuates so as to increase. However, since the pass transistor PT1 is on, the on/off state of the pass transistor PT1 does not change even if the potential of the node Q fluctuates so as to increase.

FIG. 14B shows a second situation that the memory transistor M11 is in a written state, the memory transistor M21 is in an erased state, and the input signal to the pass transistor PT1 is changed from H to L. When the input signal to the pass transistor PT1 is changed from H to L, the potential of the node Q fluctuates so as to decrease. Although the pass transistor PT1 is on, it may be turned off instantaneously because of the potential reduction of the node Q. However, the signal that should be allowed to pass through the pass transistor PT1 is the low-level signal. Even if the pass transistor PT1 is turned off instantaneously to disable passage of the low-level signal, this does not cause an erroneous operation because the state that the low-level signal cannot pass through the pass transistor PT1 can be considered equivalent to a state that a low-level signal is output.

FIG. 14C shows a third situation that the memory transistor M11 is in an erased state, the memory transistor M21 is in a written state, and the input signal to the pass transistor PT1 is changed from L to H. Although the pass transistor PT1 is off, it may be turned on instantaneously because of an upward fluctuation of the potential of the node Q. As a result, the high-level signal that should not be allowed to pass through the pass transistor PT1 may pass through it to cause an erroneous operation of the logic switch.

FIG. 14D shows a fourth situation that the memory transistor M11 is in an erased state, the memory transistor M21 is in a written state, and the input signal to the pass transistor PT1 is changed from H to L. Since the pass transistor PT1 is off, the on/off state of the pass transistor PT1 does not change even if the potential of the node Q fluctuates so as to decrease.

As described above, the logic switch may operate erroneously in the third situation. In the third situation, the memory transistor M11 is in an erased state, the memory transistor M21 is in a written state. In this case, the ground potential is supplied to the node Q through the memory transistor M11. Therefore, the time it takes for the potential of the node Q to return to the original potential when the potential of the node Q fluctuates in the third situation can be shortened by increasing the driving force of the memory transistor M11 by increasing its channel width.

On the other hand, in the first, second, and fourth situations, a fluctuation of the potential of the node Q does not affect the operation of the logic switch. Therefore, the driving force of the memory transistor M21 may be lower than that of the memory transistor M11. It is therefore concluded that an erroneous operation of the logic switch can be prevented without suppressing the increase of the chip area by setting the channel width W2 of the memory transistor M21 smaller than the channel width W1 of the memory transistor M11.

The fact that the channel widths W1 and W2 have different design values becomes apparent by referring to CAD (computer-aided design) drawings which are used for designing lithography masks. In general, corrections such as OPC (optical proximity correction) are made after pattern layout. To check design values, CAD drawings before the corrections are referred to.

In actual device manufacture, a channel width after processing has variations due to resist-related variations, variations caused by a primer layer formed on a wafer, and other factors. For example, the ITRS (International Technology Roadmap for Semiconductors) 2009 edition states that the variation of a channel size should be such that $3\sigma$ ($\sigma$: standard deviation) is within 10% of an average size. Therefore, if the difference between the average value W1(ave) of channel widths W1 in a chip and the average value W2(ave) of channel widths W2 in the chip is small, channel width differences may be buried in variations. However, W1(ave) is larger than W2(ave) by 10% or more, that difference would be effective in preventing an erroneous operation of the logic switch.

The values W1(ave) and W2(ave) can be known by opening a manufactured chip and observing the shapes of gate electrodes with an electron microscope or the like.

By setting the channel widths W1 and W2 different from each other, work (verification) of checking whether or not data has been written to an individual memory transistor can be carried out. In the embodiment, verification is carried out by, for example, applying a prescribed verify voltage to the word line WL1 and checking the resistance between the bit lines BL1 and BL2.

When both of the memory transistors M11 and M21 are in an erased state, the resistance between the bit lines BL1 and BL2 is small. In contrast, when data has been written to one of the memory transistors M11 and M21 and the channel resistance of the one memory transistor has changed to a large extent, the resistance between the bit lines BL1 and BL2 becomes approximately equal to the channel resistance of the data-written memory transistor. If the memory transistors M11 and M21 have the same structure, which of them data has been written to cannot be determined from the resistance between the bit lines BL1 and BL2. In the embodiment, since the channel widths W1 and W2 are different from each other, which of the memory transistors M11 and M21 data has been written to can be determined from the resistance between the bit lines BL1 and BL2 because of a difference between the channel resistance values of data-written memory transistors.

To enable verification, it is necessary that the channel width W1 be set greater than the channel width W2 in every cell of the logic switch. Since pattern size variations in device manufacture are considered within 10%, taking both of W1 variations and W2 variation into consideration, it can be said that verification is possible if W1(ave) and W2(ave) have a difference of 20% or more.

Methods for enabling verification other than the method of setting the channel widths W1 and W2 different from each other are also conceivable: a method of setting the gate lengths of the memory transistors M11 and M21 different from each other and a method of setting not only the channel widths W1 and W2 but also the gate lengths of the memory transistors M11 and M21 different from each other. However, the threshold voltage Vth of a transistor depends on the gate length. Therefore, if the memory transistors M11 and M21 have different gate lengths, they are different from each other in Vth and VDsat and hence the write voltage needs to be varied depending on which of them data is to be written to. This makes it necessary to prepare many power supply voltages and hence results in cost increase. In contrast, in the embodiment, since changing the channel width does not affect Vth or VDsat, the same write voltage can be used whichever memory transistor data is to be written to.

In the embodiment, the channel width of the memory transistor M11 is set greater than that of the memory transistor M21. However, if the bit line 13L2 is given the ground potential and the bit line BL1 is given the power supply voltage while the logic switch is in operation, the channel width of the memory transistor M21 is set greater than that of the memory transistor M11.

The writing method and the reading method of this embodiment can be the same as those of the first embodiment. And each of the charge storage film and the block film used in this embodiment can be a film that satisfies the same requirements as satisfied by the film used in the first embodiment.

According to the embodiments, selective writing to a memory transistor can be performed, the threshold voltage Vth of a data-written memory transistor can be made sufficiently high, and back tunneling can be prevented when data is erased from a memory transistor, thereby realizing a programmable logic switch in which writing and erasure can be performed without causing an erroneous operation and whose chip area is small. Furthermore, the second embodiment can decrease the influence of a fluctuation of the potential of the node Q when the input signal to the pass transistor is changed and can also prevent an erroneous operation, while suppressing increase of the chip area.

The invention is not limited to the above embodiments and can be modified as appropriate without departing from the spirit and scope of the invention. For example, the programmable logic switches according to the above embodiments may be used in an electronic device, such as, an FPGA (field programmable gate array) in which logic operational circuits or interconnection circuits are reconfigurable.

A control method for the programmable logic switches according to the above embodiments may be expressed, as follows. That is, the embodiments provide a method for controlling a programmable logic switch, the programmable logic switch including: a first nonvolatile memory having: a first channel region provided between a first source and a first drain; a first insulating film formed on the first channel region; a first charge storage film formed on the first insulating film; a second insulating film formed on the first charge storage film; and a first gate electrode formed on the second insulating film; a second nonvolatile memory having: a second channel region provided between a second source and a second drain; a third insulating film formed on the second channel region; a second charge storage film formed on the third insulating film; a fourth insulating film formed on the second charge storage film; and a second gate electrode formed on the fourth insulating film; a first line connected to the first gate electrode and to the second gate electrode; a second line connected to the first source; a third line connected to the first drain and to the second drain; a fourth line connected to the second source; a substrate electrode through which a substrate voltage is applied to a well, the first nonvolatile memory and the second nonvolatile memory being formed in the well; and one or more first logic transistors connected to the third line, each first logic transistor being connected to the third line at a gate electrode thereof, no logic transistor other than the first logic transistors being connected to the third line, the method including: applying a first write voltage to the first line; applying a second write voltage to the second line; and applying a third write voltage lower than the second write voltage to the fourth line, to thereby change the first nonvolatile memory from an erased state to a written state and leave the second nonvolatile memory being in the erased state.

To change one of the first nonvolatile memory and the second nonvolatile memory to the written state, a ground voltage may be applied as the substrate voltage to the substrate electrode. To change one of the first nonvolatile memory and the second nonvolatile memory to the written state, a negative voltage may be applied as the substrate voltage to the substrate electrode. The first write voltage may be applied to the first line before applying the second write voltage to the second line. The second write voltage may be lower than the first write voltage. The first write voltage may be set to be lower than a prescribed voltage that is necessary for writing data to the first nonvolatile memory and the second nonvolatile memory using an FN current. To render both of the first nonvolatile memory and the second nonvolatile memory into the erased state, a prescribed erase voltage may be applied to the first line and a ground voltage may be applied to the substrate electrode. The first logic transistor may be on/off-controlled by increasing a threshold voltage of one of the first nonvolatile memory and the second nonvolatile memory to be higher than a threshold voltage of the other, and applying a first operating voltage to one of the second line and the fourth line while applying a second operating voltage higher than the first operating voltage to the other. Provided that a channel width of one of the first nonvolatile memory and the second nonvolatile memory may be greater than a channel width of the other, the first logic transistor may be on/off-controlled by applying a first operating voltage to one, connected to the one nonvolatile memory having the greater channel width, of the second line and the fourth line, and applying a second operating voltage which is higher than the first operating voltage to the other of the second line and the fourth line.

The invention claimed is:

1. A programmable logic switch comprising:
   a first nonvolatile memory having:
      a first channel region provided between a first source and a first drain;
      a first insulating film formed on the first channel region;
      a first charge storage film formed on the first insulating film;
      a second insulating film formed on the first charge storage film; and
      a first gate electrode formed on the second insulating film;
   a second nonvolatile memory having:
      a second channel region provided between a second source and a second drain;
      a third insulating film formed on the second channel region;
      a second charge storage film formed on the third insulating film;
      a fourth insulating film formed on the second charge storage film; and
      a second gate electrode formed on the fourth insulating film;
   a first line connected to the first gate electrode and to the second gate electrode;
   a second line connected to the first source;
   a third line connected to the first drain and to the second drain;
   a fourth line connected to the second source;
   a substrate electrode through which a substrate voltage is applied to a well, the first nonvolatile memory and the second nonvolatile memory being formed in the well;
   one or more first logic transistors connected to the third line, each first logic transistor being connected to the third line at a gate electrode thereof; and
   a controller configured to connect, to change the first nonvolatile memory from an erased state to a written state and leave the second nonvolatile memory being in the erased state,
      a first write voltage to the first line,
      a second write voltage to the second line, and
      a third write voltage lower than the second write voltage to the fourth line,
   wherein the controller connects the first write voltage to the first line before connecting the second write voltage to the second line.

2. The programmable logic switch of claim 1, wherein at least one of the first logic transistors is formed in the well together with the first nonvolatile memory and the second nonvolatile memory.

3. The programmable logic switch of claim 1, wherein, to change one of the first nonvolatile memory and the second nonvolatile memory to the written state, the controller connects a ground voltage as the substrate voltage to the substrate electrode.

4. The programmable logic switch of claim 1,
wherein, to change one of the first nonvolatile memory and the second nonvolatile memory to the written state, the controller connects a negative voltage as the substrate voltage to the substrate electrode.

5. The programmable logic switch of claim 1,
wherein the second write voltage is lower than the first write voltage.

6. The programmable logic switch of claim 1,
wherein each of the first charge storage film and the second charge storage film is a silicon nitride film or a silicon oxynitride film.

7. The programmable logic switch of claim 6,
wherein each of the first charge storage film and the second charge storage film has an average mole ratio x of nitrogen to silicon satisfying $0.67<x<1.33$.

8. The programmable logic switch of claim 6,
wherein the first charge storage film has a smaller mole ratio of nitrogen to silicon at near an interface with the second insulating film, as compared with at near an interface with the first insulating film, and
wherein the second charge storage film has a smaller mole ratio of nitrogen to silicon at near an interface with the fourth insulating film, as compared with at near an interface with the third insulating film.

9. The programmable logic switch of claim 1,
wherein each of the first charge storage film and the second charge storage film is a laminated film including a silicon nitride film or a silicon oxynitride film.

10. The programmable logic switch of claim 1,
wherein a threshold voltage of the first nonvolatile memory or the second nonvolatile memory being in the erased state is lower than 0 V.

11. The programmable logic switch of claim 1,
wherein each of the second insulating film and the fourth insulating film contains an insulative material whose relative permittivity with respect to vacuum is larger than 7.

12. The programmable logic switch of claim 11,
wherein each of the second insulating film and the fourth insulating film has a film containing silicon oxide and a film containing the insulative material, the latter being adjacent to the former.

13. The programmable logic switch of claim 1,
wherein each of the first gate electrode and the second gate electrode is made of a conductive material whose work function is larger than 4.05 eV.

14. The programmable logic switch of claim 1,
wherein each of the first gate electrode and the second gate electrode is made of an n-type or p-type polysilicon, and
wherein the second insulating film contains a silicon nitride film being adjacent to the first gate electrode, whereas the fourth insulating film contains a silicon nitride film being adjacent to the second gate electrode.

15. The programmable logic switch of claim 1,
wherein, to render both of the first nonvolatile memory and the second nonvolatile memory into the erased state, the controller connects
a prescribed erase voltage to the first line and
a ground voltage to the substrate electrode.

16. The programmable logic switch of claim 1,
wherein the controller performs on/off control of the one or more first logic transistors by increasing a threshold voltage of one of the first nonvolatile memory and the second nonvolatile memory to be higher than a threshold voltage of the other, and connecting a first operating voltage to one of the second line and the fourth line while connecting a second operating voltage higher than the first operating voltage to the other.

17. The programmable logic switch of claim 1,
wherein a channel width of one of the first nonvolatile memory and the second nonvolatile memory is greater than a channel width of the other.

18. The programmable logic switch of claim 1,
wherein no logic transistor other than the first logic transistor is connected to the third line.

19. The programmable logic switch of claim 1,
wherein the controller connects a ground voltage or a negative voltage to the fourth line, as the third write voltage.

20. The programmable logic switch of claim 1,
wherein the controller sets the third write voltage such that a difference between the third voltage and the substrate voltage is smaller than a breakdown voltage of a gate insulating film of the one or more first logic transistors.

21. The programmable logic switch of claim 1,
wherein the controller connects a voltage which is the same with the substrate voltage to the fourth line, as the third write voltage.

22. A semiconductor integrated circuit comprising a plurality of wirings and a connection unit connected to the wirings, the connection unit comprising one or more programmable logic switches, each programmable logic switch comprising:
a first nonvolatile memory having:
a first channel region provided between a first source and a first drain;
a first insulating film formed on the first channel region;
a first charge storage film formed on the first insulating film;
a second insulating film formed on the first charge storage film; and
a first gate electrode formed on the second insulating film;
a second nonvolatile memory having:
a second channel region provided between a second source and a second drain;
a third insulating film formed on the second channel region;
a second charge storage film formed on the third insulating film;
a fourth insulating film formed on the second charge storage film; and
a second gate electrode formed on the fourth insulating film;
a first line connected to the first gate electrode and to the second gate electrode;
a second line connected to the first source;
a third line connected to the first drain and to the second drain;
a fourth line connected to the second source;
a substrate electrode through which a substrate voltage is applied to a well, the first nonvolatile memory and the second nonvolatile memory being formed in the well;
one or more first logic transistors connected to the third line, each first logic transistor being connected to the third line at a gate electrode thereof; and
a controller configured to connect, to change the first nonvolatile memory from an erased state to a written state and leave the second nonvolatile memory being in the erased state,
a first write voltage to the first line,
a second write voltage to the second line, and
a third write voltage lower than the second write voltage to the fourth line, wherein the controller connects the first write voltage to the first line before connecting the second write voltage to the second line.

23. A programmable logic device comprising a plurality of wirings and a connection unit configured to switch connection/disconnection of the wirings, the connection unit comprising one or more programmable logic switches, each programmable logic switch comprising:
- a first nonvolatile memory having:
  - a first channel region provided between a first source and a first drain;
  - a first insulating film formed on the first channel region;
  - a first charge storage film formed on the first insulating film;
  - a second insulating film formed on the first charge storage film; and
  - a first gate electrode formed on the second insulating film;
- a second nonvolatile memory having:
  - a second channel region provided between a second source and a second drain;
  - a third insulating film formed on the second channel region;
  - a second charge storage film formed on the third insulating film;
  - a fourth insulating film formed on the second charge storage film; and
  - a second gate electrode formed on the fourth insulating film;
- a first line connected to the first gate electrode and to the second gate electrode;
- a second line connected to the first source;
- a third line connected to the first drain and to the second drain;
- a fourth line connected to the second source;
- a substrate electrode through which a substrate voltage is applied to a well, the first nonvolatile memory and the second nonvolatile memory being formed in the well;
- one or more first logic transistors connected to the third line, each first logic transistor being connected to the third line at a gate electrode thereof; and
- a controller configured to connect, to change the first nonvolatile memory from an erased state to a written state and leave the second nonvolatile memory being in the erased state,
  - a first write voltage to the first line,
  - a second write voltage to the second line, and
  - a third write voltage lower than the second write voltage to the fourth line, wherein the controller connects the first write voltage to the first line before connecting the second write voltage to the second line, and wherein the connection unit switches the connection/disconnection of the wirings based on information written in the first nonvolatile memory and information written in the second nonvolatile memory.

* * * * *